United States Patent
Moon et al.

(10) Patent No.: US 9,905,310 B2
(45) Date of Patent: Feb. 27, 2018

(54) METHOD FOR CONTROLLING MAGNETIC DOMAIN WALL OF MAGNETIC STRUCTURE AND MAGNETIC MEMORY DEVICE USING SAME

(71) Applicant: KOREA RESEARCH INSTITUTE OF STANDARDS AND SCIENCE, Daejeon (KR)

(72) Inventors: Kyoungwoong Moon, Daejeon (KR); Chanyong Hwang, Seoul (KR)

(73) Assignee: KOREA RESEARCH INSTITUTE OF STANDARDS AND SCIENCE, Daejeon (KR)

(*) Notice: Subject to any disclaimer, the term of this patent is extended or adjusted under 35 U.S.C. 154(b) by 0 days.

(21) Appl. No.: 15/325,827

(22) PCT Filed: Jan. 16, 2015

(86) PCT No.: PCT/KR2015/000458
§ 371 (c)(1),
(2) Date: Jan. 12, 2017

(87) PCT Pub. No.: WO2016/010218
PCT Pub. Date: Jan. 21, 2016

(65) Prior Publication Data
US 2017/0162274 A1   Jun. 8, 2017

(30) Foreign Application Priority Data
Jul. 15, 2014   (KR) .................. 10-2014-0089300

(51) Int. Cl.
G11C 19/08   (2006.01)
G11C 11/14   (2006.01)

(52) U.S. Cl.
CPC ........ *G11C 19/0808* (2013.01); *G11C 19/085* (2013.01); *G11C 19/0816* (2013.01)

(58) Field of Classification Search
CPC .................. G11C 19/0808; G11C 19/0825
(Continued)

(56) References Cited

U.S. PATENT DOCUMENTS 8,750,012 B1   6/2014 Abraham et al.
2007/0262301 A1* 11/2007 Cowburn ............... B82Y 10/00
                                                          257/40
(Continued)

FOREIGN PATENT DOCUMENTS

KR   10-2008-0064002 A   7/2008
KR   10-2009-0079005 A   7/2009
KR   10-2009-0080335 A   7/2009

OTHER PUBLICATIONS

Andrew Kunz, Improved magnetic domain-wall control with transverse fields, Sep. 2010, SPIE Newsroom, 1-2.*

*Primary Examiner* — Hoai V Ho
*Assistant Examiner* — Jay Radke
(74) *Attorney, Agent, or Firm* — Sang Ho Lee; Novick, Kim & Lee, PLLC (57) ABSTRACT

The present invention provides a method for controlling a magnetic domain wall of a magnetic structure and a magnetic memory device using same. The method includes: a first step of applying a first magnetic field in a first direction to a magnetic structure having a plurality of magnetic domains and a magnetic domain wall between the magnetic domains, and applying a second magnetic field in a second direction to the magnetic structure, the first direction being parallel to the magnetization direction of the magnetic domain wall and the second direction being parallel to the magnetization direction of the magnetic domain wall; and a second step of applying a third magnetic field in a direction opposite to the first direction to the magnetic structure and applying a fourth magnetic field in a direction opposite to the second direction to the magnetic structure, wherein the (Continued)

magnetic domain wall can be moved uniformly in a direction parallel to the magnetization direction of the magnetic domain wall or the magnetization direction of the magnetic domains.

22 Claims, 7 Drawing Sheets

(58) Field of Classification Search
USPC .................................................. 365/158, 171
See application file for complete search history.

(56) References Cited

U.S. PATENT DOCUMENTS

| | | |
|---|---|---|
| 2010/0046268 A1 | 2/2010 | Moriya et al. |
| 2011/0085258 A1* | 4/2011 | Bae .................. B82Y 25/00 360/31 |
| 2011/0111259 A1* | 5/2011 | Kunz .................. B82Y 10/00 428/800 |

* cited by examiner

METHOD FOR CONTROLLING MAGNETIC DOMAIN WALL OF MAGNETIC STRUCTURE AND MAGNETIC MEMORY DEVICE USING SAME

TECHNICAL FIELD

The present invention relates to a uniform movement of a magnetization state of a magnetic body, and more particularly, to a method for controlling magnetic domain wall of a magnetic structure, which is capable of uniformly moving a magnetization state, and to a magnetic memory device using the same.

BACKGROUND ART

As the information industry develops, large-volume information processing is required, and demand for information storage media capable of storing a large amount of information is continuously increasing. A hard-disk drive (HDD), which is widely used as information storage medium, generally includes a read/write head and a rotating medium on which information is recorded, and can store large amount of information of 100 GB or more. However, a storage device having a rotating part such as an HDD tends to be worn out, and there is a disadvantage in that reliability is low due to a possibility of occurrence of an error during operation.

In recent years, researches and developments have been made on a new data storage device using the principle of magnetic domain wall movement of magnetic materials. In general, a magnetic micro domain constituting a magnetic structure is called a magnetic domain. In one magnetic domain, it is characterized in that the rotation of electrons, that is, the magnetic moment, is in the same direction. The size and magnetization direction of the magnetic domain can be appropriately controlled by the shape, size and external energy of the magnetic material. The magnetic domain walls represent the boundaries of magnetic domains having different magnetization directions. The magnetic domain wall is characterized in that it can be moved by a magnetic field or a current applied to the magnetic material.

Meanwhile, if the width of a magnetic thin film is reduced to form a ribbon-like structure, the magnetization state can be uniformly formed in the width direction, and it can be used as a memory device when matched to "1" or "0" depending on the state of the magnetic domain. This type of memory is called a magnetic domain wall racetrack memory. In order to operate the magnetic domain wall racetrack memory device, it is necessary that all the magnetic domain walls move uniformly in the longitudinal direction of one device. The magnetic domain wall can be moved by using a magnetic field or electric current. Meanwhile, recently, a lot of studies have been made on a method for moving magnetic domain walls by flowing electric current.

However, if electric current that is sufficient for moving magnetic domain walls is supplied to a memory device, the problem of temperature increase due to Joule heating caused by the electric current becomes so serious that the memory device is destroyed. In addition, although the magnetic domain wall can be moved by using a magnetic field uniformly applied from the outside, it is problematic that the magnetic domain wall cannot be used since it only moves away or comes closer without uniformly moving in one direction.

Furthermore, another method using a magnetic field has recently been proposed. A device is oriented such that magnetic domain walls move in only one direction and the directionality of the magnetic domain wall of the device is determined by forming a device with asymmetric serration or by post-processing. When a magnetic field is applied to such an asymmetric sample such that the direction of the magnetic field continuously changes in the positive or negative direction, the magnetic domain wall moves in one direction while reciprocating. This method has a disadvantage in that a complicated process is required to orient the device.

DETAILED DESCRIPTION OF THE INVENTION

Technical Problem

The present invention has been made to solve a lot of problems including the above problems, by providing a method for controlling a magnetic structure capable of uniformly moving a magnetic domain wall, and a magnetic memory device using the same, wherein no control by electric current is provided, no complicated structure for breaking the reciprocating symmetry of the movement of magnetic domain walls, and magnetic fields having different directions are alternately applied. However, these problems are for illustrative purposes only, and the scope of the present invention is not limited thereto.

Technical Solution

According to an aspect of the present invention, there is provided a method for controlling a magnetic domain wall of a magnetic structure, the method comprising: a first step of applying a first magnetic field in a first direction to a magnetic structure having a plurality of magnetic domains and a magnetic domain wall between the magnetic domains, and applying a second magnetic field in a second direction to the magnetic structure, the first direction being parallel to the magnetization direction of the magnetic domain wall and the second direction being parallel to the magnetization direction of the magnetic domains; and a second step of applying a third magnetic field in a direction opposite to the first direction to the magnetic structure and applying a fourth magnetic field in a direction opposite to the second direction to the magnetic structure, wherein the magnetic domain wall can be moved uniformly in a direction parallel to the magnetization direction of the magnetic domain wall or the magnetization direction of the magnetic domains.

Furthermore, there is provided a method for controlling a magnetic domain wall of a magnetic structure, the method comprising: a first step of applying a magnetic field to a magnetic structure having a plurality of magnetic domains and a magnetic domain wall between the magnetic domains, the magnetic field being not parallel to the magnetization direction of the magnetic domain wall and the magnetization direction of the magnetic domains, respectively; and a second step of applying another magnetic field in a direction opposite to the direction of the magnetic field to the magnetic structure, wherein the magnetic domain wall can be moved uniformly in a direction parallel to the magnetization direction of the magnetic domain wall or the magnetization direction of the magnetic domains.

When the magnetic structure has perpendicular magnetic anisotropy, the first and the second steps may be carried out such that the magnetic domain wall is moved uniformly in a direction parallel to the magnetization direction of the magnetic domain wall.

When the magnetic structure has horizontal magnetic anisotropy, the first and the second steps may be carried out such that the magnetic domain wall is moved uniformly in a direction parallel to the magnetization direction of the magnetic domains.

The magnetic domain wall may be moved uniformly in a direction parallel to the magnetization direction of the magnetic domain wall or the magnetization direction of the magnetic domains, the magnetization direction of the magnetic domain wall being determined according to the kind of the magnetic structure.

The first and the second steps may be carried out such that the magnetic domain wall can be moved uniformly in a direction parallel to the magnetization direction of the magnetic domain wall or the magnetization direction of the magnetic domains while keeping the distance between the magnetic domain walls constant.

The first and the second steps may be repeated alternately such that the magnetization state of the magnetic structure can be moved uniformly by a predetermined distance in a direction parallel to the magnetization direction of the magnetic domain wall or the magnetization direction of the magnetic domains.

The second direction may be perpendicular to the first direction.

The first magnetic field or the third magnetic field may include a component parallel to the magnetization direction of the magnetic domain wall such that an energy difference occurs between the magnetic domain walls, thereby capable of controlling the moving velocity of the magnetic domain wall.

The second magnetic field or the fourth magnetic field may include a component parallel to the magnetization direction of the magnetic domains such that a size difference occurs between the magnetic domains, thereby capable of controlling the moving velocity of the magnetic domain wall.

According to another aspect of the present invention, there is provided a magnetic memory device comprising the magnetic structure according to the above-described method.

The magnetic structure may have any one of a ribbon shape, a line shape, and a thin film shape.

The magnetic memory device may further include a data recording device and a read head connected to the magnetic structure, and the magnetic memory device may be capable of recording or deleting data by the data recording device and the read head.

Advantageous Effects

According to embodiments of the present invention as described above, the magnetic domain wall can be uniformly moved by controlling only the direction in which the magnetic field is applied, without destroying the magnetic memory device by the Joule heat generated by the electric current applied to the magnetic memory device.

Furthermore, there is provided a method for controlling a magnetic structure having a simple structure and a magnetic memory device using the same, wherein the device itself does not determine the directionality of the magnetic domain wall movement. Of course, the scope of the present invention is not limited by these effects.

MODE OF THE INVENTION

Hereinafter, embodiments of the present invention will be described in detail with reference to the accompanying drawings. It should be understood, however, that the present invention is not limited to the disclosed embodiments, but may be embodied in many different forms. These embodiments are provided so that the disclosure of the present invention will be thorough and complete, and are provided to fully illustrate the scope of the invention to those of ordinary skill in the art. Also, for convenience of explanation, the components may be exaggerated or reduced in size.

Generally, a ferromagnetic structure refers to a material having a property of aligning adjacent magnetic moments in parallel with each other. When a ferromagnetic structure is formed into a thin film having a thickness of several nanometers and another material is stacked on or under the magnetic layer, a magnetic thin film having perpendicular magnetism can be formed.

In addition, when viewed from the top of the magnetic thin film, a region aligned with the N-pole or S-pole is referred to as a magnetic domain, and a domain wall is formed between the magnetic domains having different magnetization directions. The magnetic domain walls are moved by, for example, two driving forces, i.e. magnetic field and electric current. The speed of the magnetic domain wall moved by the magnetic field belongs to the category of creep in a small magnetic field region. Also, the moving speed of the magnetic domain wall by electric current belongs to the category of creep as in the case of the magnetic field, and the speed of the magnetic domain wall depends largely on the slope of the magnetic domain wall with respect to the direction of the electric current. Recently, a variety of application possibilities using the phenomenon of a magnetic domain wall movement by electric current have been suggested. A typical example of such is a domain wall race track memory device based on a nanowire structure.

Meanwhile, when the magnetic domain wall movement is observed for a relatively long time, the magnetic domain wall moved by current shows destruction of the device by Joule heat generated by the current or rapid deceleration of the moving speed as time passes.

Another method using a magnetic field orients a device such that the magnetic domain wall moves well in one direction only. The directionality of the magnetic domain wall movement is determined by forming a device having an asymmetrical serration structure or by post-processing it. When a magnetic field is applied to such an asymmetric sample such that the direction of the magnetic field continuously changes in the positive or negative direction, the magnetic domain wall moves in one direction while reciprocating. This method has a disadvantage in that a complicated process is required to orient the device. In order to solve this problem, the present invention provides a method for controlling a magnetic structure having a simple structure and a magnetic memory device using the same, wherein the device itself does not determine the directionality of the magnetic domain wall movement.

Figure 1:
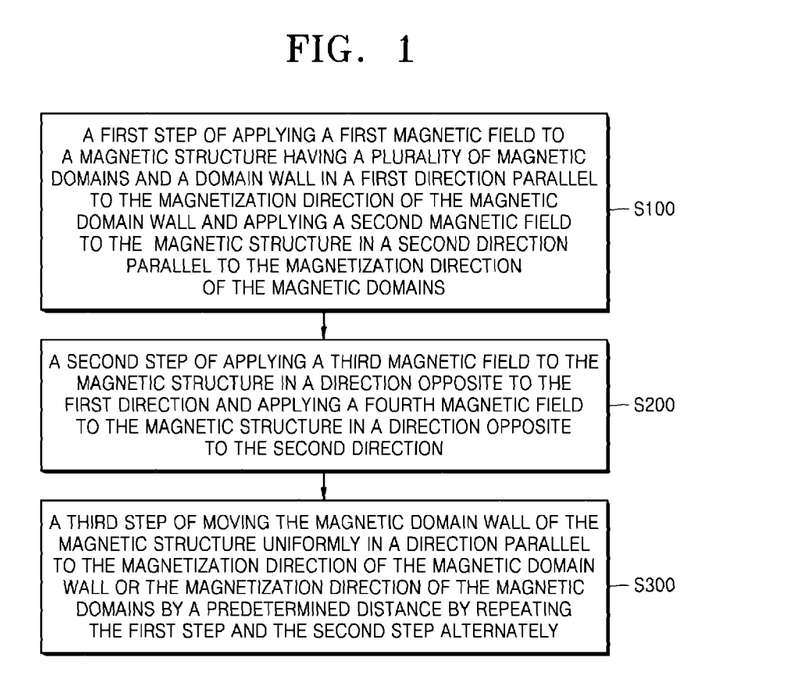
FIG. 1 is a process flow diagram schematically showing a method of controlling a magnetic domain wall of a magnetic structure according to an embodiment of the present invention.

FIG. 1 is a process flow diagram schematically showing a method of controlling a magnetic domain wall of a magnetic structure according to an embodiment of the present invention.

Referring to FIG. 1, a method for controlling a magnetic domain wall of a magnetic structure includes a first step S100 of applying a first magnetic field to a magnetic structure having a plurality of magnetic domains and a domain wall in a first direction parallel to the magnetization direction of the magnetic domain wall and applying a second magnetic field to the magnetic structure in a second direction parallel to the magnetization direction of the magnetic domains, and a second step S200 of applying a third magnetic field to the magnetic structure in a direction opposite to the first direction and applying a fourth magnetic field to the magnetic structure in a direction opposite to the second direction, and a third step S300 of moving the magnetic domain wall of the magnetic structure uniformly in a direction parallel to the magnetization direction of the magnetic domain wall or the magnetization direction of the magnetic domains by a predetermined distance by repeating the first step and the second step alternately. The first step S100 and the second step S200 are embodiments of the present invention, and the first direction can have an opposite direction therefrom and the second direction can have an opposite direction therefrom, depending on a direction in which the magnetic domain wall of the magnetic structure is to be moved.

Figure 2:
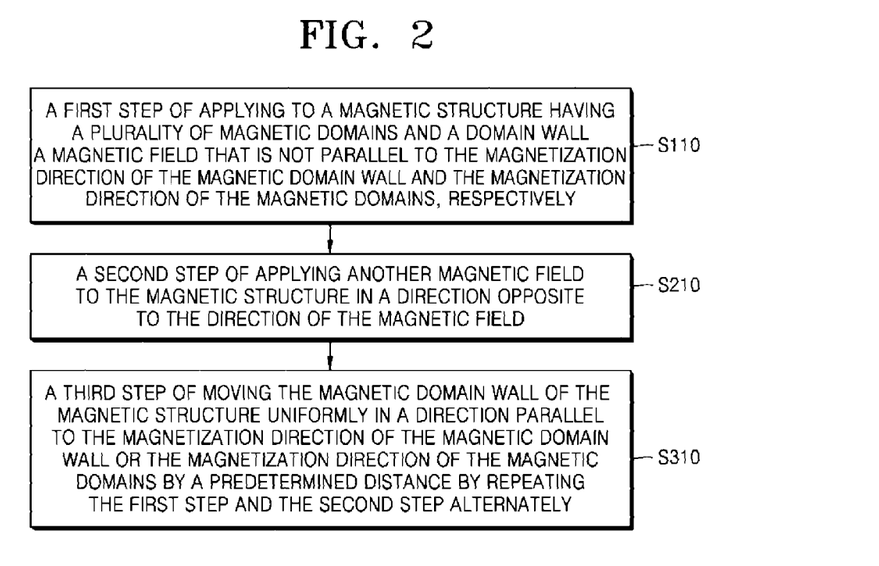
FIG. 2 is a process flow chart schematically showing a method of controlling a magnetic domain wall of a magnetic structure according to another embodiment of the present invention.

FIG. 2 is a process flow chart schematically showing a method of controlling a magnetic domain wall of a magnetic structure according to another embodiment of the present invention.

Referring to FIG. 2, a method for controlling a magnetic domain wall of a magnetic structure includes a first step S110 of applying to a magnetic structure having a plurality of magnetic domains and a domain wall a magnetic field that is not parallel to the magnetization direction of the magnetic domain wall and the magnetization direction of the magnetic domains, respectively, a second step S210 of applying another magnetic field to the magnetic structure in a direction opposite to the direction of the magnetic field, and a third step S310 of moving the magnetic domain wall of the magnetic structure uniformly in a direction parallel to the magnetization direction of the magnetic domain wall or the magnetization direction of the magnetic domains by a predetermined distance by repeating the first step and the second step alternately.

Hereinafter, details of the method of controlling the magnetic domain wall of the magnetic structure will be described with reference to FIGS. 3A to 3D, and FIGS. 4, 5, and 6.

FIGS. 3A to 3D are views schematically showing a magnetic structure according to an embodiment of the present invention.

Figure 3A:
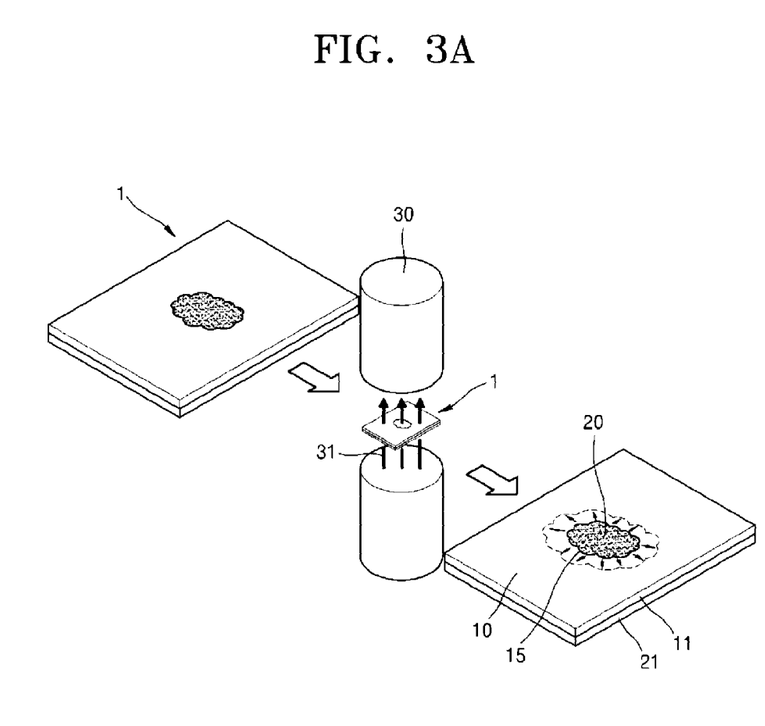
FIGS. 3A to 3D are views schematically showing a magnetic structure according to an embodiment of the present invention.

Referring to FIG. 3A, a ferromagnetic structure has a property of aligning adjacent magnetic moments in parallel with each other. When the ferromagnetic structure is made into a thin film having a thickness of about several nanometers and a material having different components is stacked, a magnetic structure 1 having perpendicular or horizontal magnetism can be made. For example, the magnetic structure 1 may have one of a ribbon shape, a line shape, or a thin film shape. The magnetic structure having perpendicular magnetism may be referred to as a magnetic structure 1 having perpendicular magnetic anisotropy. Here, the perpendicular magnetic anisotropy takes one of the two magnetization states, meaning that the magnetization direction is a direction into or out of a surface direction with reference to the upper surface of the magnetic structure 1. That is, either the N-pole 11 or the S-pole 21 can be seen from the top of the magnetic structure 1.

The region aligned with the N-pole 11 or the region aligned with the S-pole 21 when viewed from above the surface of the magnetic structure 1 is called a magnetic domain. For example, each of them may be referred to as an up magnetic domain (up domain, N-pole stands up and S-pole down) and a down magnetic domain (down domain, S-pole stands up and N-pole down). The magnetic domains 10 and 20 indicate regions in which the magnetization states are uniformly aligned.

A domain wall 15 may be formed between two magnetic domains 10 and 20 having different magnetization directions. The magnetization direction in the magnetic domain wall 15 may gradually change from the magnetization direction of one of the magnetic domains 10 and 20 to the magnetization direction of the other magnetic domains 10 and 20. It is generally known that the change in magnetization direction occurs only in the length of several tens of nanometers. That is, the width of the magnetic domain wall 15 is several tens of nanometers in size.

Meanwhile, when the magnetic domain wall 15 exists in the magnetic structure 1, the magnetic domain wall 15 can be moved when a uniform external magnetic field 31 in the upward or downward direction is applied to the magnetic structure 1 using a magnet 30. For example, when a magnetic field in the upward direction is applied, the second magnetic domains 20 are subjected to a force to change to the first magnetic domain 10 since the energy of the first magnetic domains 10 is more stable than the energy of the second magnetic domains 20. This change easily occurs in the magnetic domain wall 15 and causes the magnetic domain wall 15 to move and each magnetic domain to expand or contract. Here, the magnetization direction is determined according to the material of the magnetic structure 1.

Figure 3B:
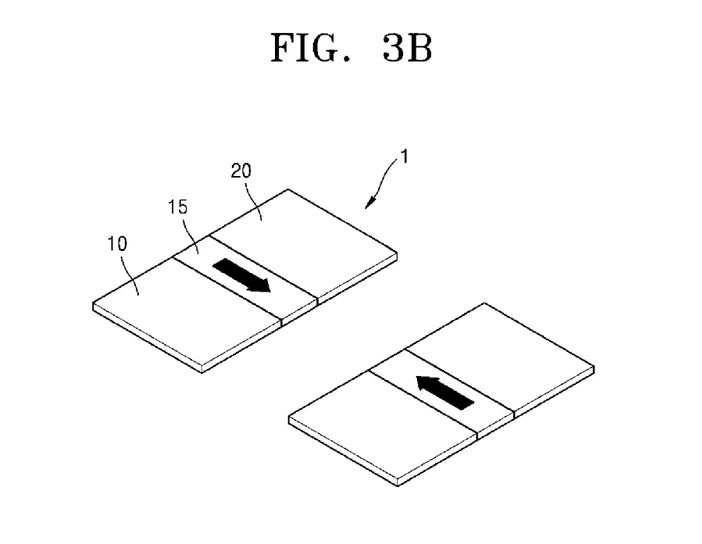
Figure 3C:
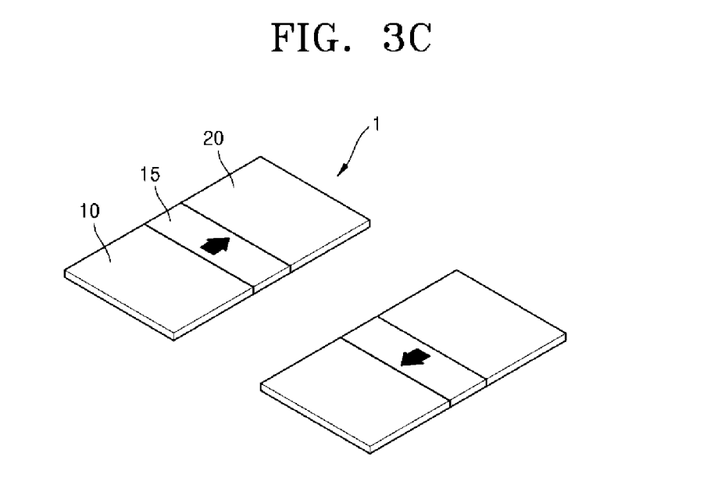

Referring to FIGS. 3B and 3C, the magnetic domain wall 15 always exists between the first magnetic domain 10 and the second magnetic domain 20. The magnetization direction at the center of the magnetic domain wall 15 is in a direction parallel to the surface of the magnetic structure 1. This is because the magnetization states of the first magnetic domain 10 and the second magnetic domain 20 must be connected through a continuous rotation. FIG. 3B shows a Bloch type magnetic domain wall, and FIG. 3C shows a Neel type magnetic domain wall. It is recently found that certain directionality is favored by the magnetization direction of the magnetic domain wall 15 due to the Dzyaloshinskii-Moriya interaction (DMI), and as shown in FIG. 3C, depending on the sign of the DMI coefficient, one of two Neel type magnetic domain walls is formed depending on the kind of the magnetic structure 1 having perpendicular magnetic anisotropy, that is, the property of the material. The determination of magnetization shape of the magnetic domain wall is the same in the case of the magnetic structure 1 having horizontal magnetic anisotropy.

Therefore, in an embodiment of the present invention, when an external magnetic field obliquely inclined at a predetermined angle with respect to the magnetization direction of the magnetic domains 10 and 20 and the magnetization direction of the magnetic domain wall 15 is alternately applied to the upward direction (positive direction) of surface direction and downward direction (negative direction) of surface direction of the magnetic structure 10, the magnetic domain wall 15 of the magnetic structure 1 can be moved in a direction parallel to the magnetization direction of the magnetic domain wall or the magnetization direction of the magnetic domains by the external magnetic field 31.

Figure 3D:
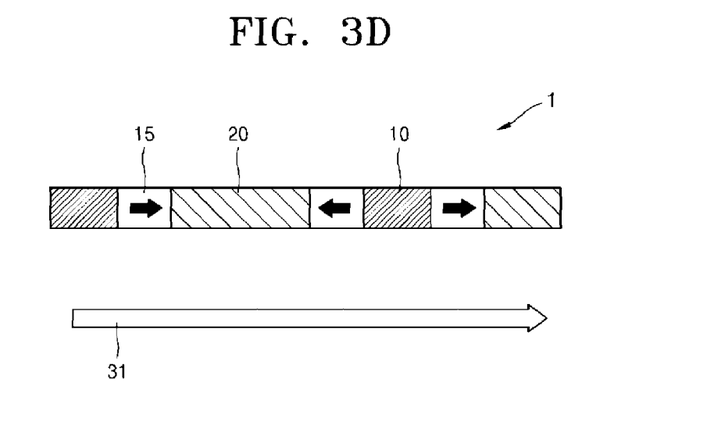

Referring to FIG. 3D, a plurality of magnetic domains 10 and 20 and magnetic domain walls 15 can be formed in the magnetic structure 1 in the form of a linear device by the influence of the DMI. The formed magnetic domain walls 15 have a magnetization state in the longitudinal direction of the magnetic structure 1 in the form of a linear device by the DMI coefficient and may be parallel or anti-parallel to the direction of the external magnetic field 31, along a direction from the first magnetic domain 10 to the second magnetic domain 20 or from the second magnetic domain 20 to the first magnetic domain 10. Therefore, when the uniform external magnetic field 31 is applied in a direction parallel to the longitudinal direction of the magnetic structure 1, an energy difference occurs between the magnetic domain wall 15 between the first magnetic domain 10 and the second magnetic domain 20 and the magnetic domain wall 15 between the second magnetic domain 20 and the first magnetic domain 10. As the magnetization direction of the magnetic domain wall 15 becomes parallel to the external magnetic field 31, the state becomes stable and the energy becomes low. In the opposite case, the state becomes unstable and the energy becomes high.

Furthermore, since the first magnetic domain 10 and the second magnetic domain 20 are both perpendicular to the horizontal magnetic field and, therefore, there is no energy difference between the two magnetic domains, the horizontal magnetic field cannot move the magnetic domain wall 15. Moreover, although the expansion and contraction of the magnetic domain wall 15 by the horizontal magnetic field occurs, its magnitude is only a few nanometers or less. According to the creep law, the speed of the magnetic domain wall 15 increases as the intensity of the perpendicular magnetic field increases, and the moving direction of the magnetic domain wall 15 can be in the direction in which the magnetic domain in a direction parallel to the perpendicular magnetic field expands. The lower the energy of the magnetic domain wall 15, the faster the moving speed of the magnetic domain wall 15.

Figure 4:
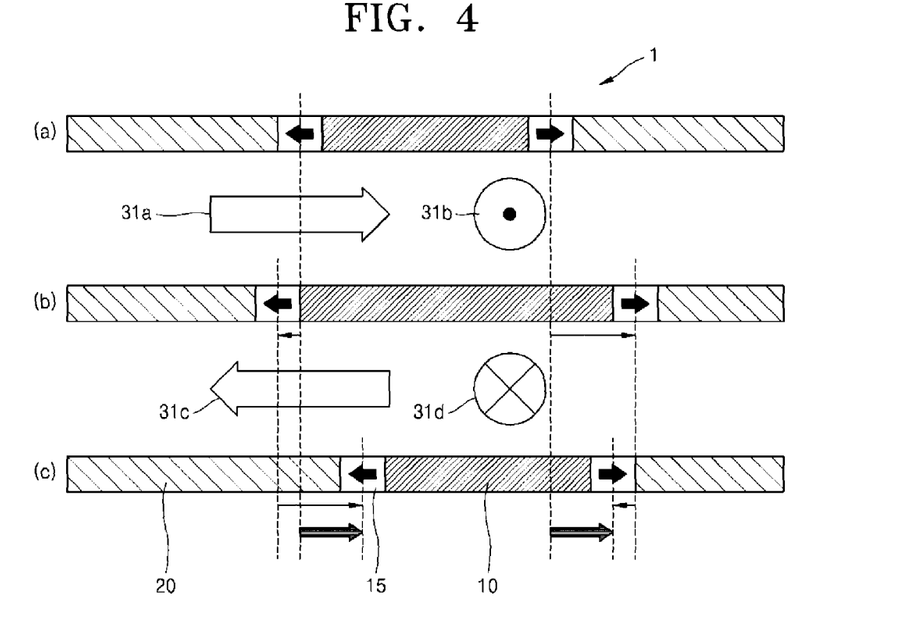
FIG. 4 is a view showing steps of a method of controlling a magnetic domain wall of a magnetic structure according to an embodiment of the present invention.

FIG. 4 is a view showing steps of a method of controlling a magnetic domain wall of a magnetic structure according to an embodiment of the present invention.

Referring to (a) and (b) of FIG. 4, since the low-energy magnetic domain wall 15 moves fast and the high-energy magnetic domain wall 15 moves relatively slowly, when, for example, a first magnetic field 31$a$ is applied in a first direction parallel to the magnetic structure 1 having perpendicular magnetic anisotropy and a second magnetic field 31$b$ is applied in a second direction perpendicular to the magnetic structure 1 along the upward direction, the magnetic domain walls 15 disposed on both sides of the first magnetic domain 10 move asymmetrically as the first magnetic domain 10 expands. Here, the vector component of the first magnetic field indicates the first direction, and the vector component of the second magnetic field indicates the second direction.

Referring to (b) and (c) of FIG. 4, when a fourth magnetic field 31$d$ is applied in a direction opposite to the second direction after the magnetic domain walls 15 of the magnetic structure 1 are moved once, the second magnetic domains 20 expand as opposed to the first case and the magnetic domain walls 15 move in a direction as opposed to the first case. However, since the direction of the third magnetic field 31$c$ is changed to a direction opposite to the first direction, the moving distance of the magnetic domain walls 15 is different from that of the first case. Here, the vector component of the third magnetic field indicates the direction opposite to the first direction, and the vector component of the fourth magnetic field indicates the direction opposite to the second direction.

When the first magnetic field 31$a$ and the second magnetic field 31$b$ are applied in the first direction and the second direction, respectively, as in the first case and the third magnetic field 31$c$ and the fourth magnetic field 31$d$ are applied again in directions opposite to the first and second directions, the position of the magnetic domain walls 15 finally moves in one direction uniformly away from the first position, or continues to move in one direction while keeping the distance between the magnetic domain walls 15 constant. Here, the first magnetic field and the second magnetic field may be perpendicular to each other, and the third magnetic field and the fourth magnetic field may be perpendicular to each other.

Therefore, when the initial magnetization state of the magnetic structure 1 having perpendicular magnetic anisotropy or horizontal magnetic anisotropy is compared with the final magnetization state of the magnetic structure 1, which has been changed by the external magnetic field 31, as the external magnetic field 31 is repeatedly applied with alternating directions, the magnetic domain walls 15 of the magnetic structure 1 can be uniformly moved in the direction of the horizontal component of the applied external magnetic field 31. The magnetic domain wall 15 can be moved while the direction of the horizontal component is a direction parallel to the magnetization direction of the magnetic domain wall or the magnetization direction of the magnetic domain, determined by the type of the magnetic structure 1.

Figure 5:
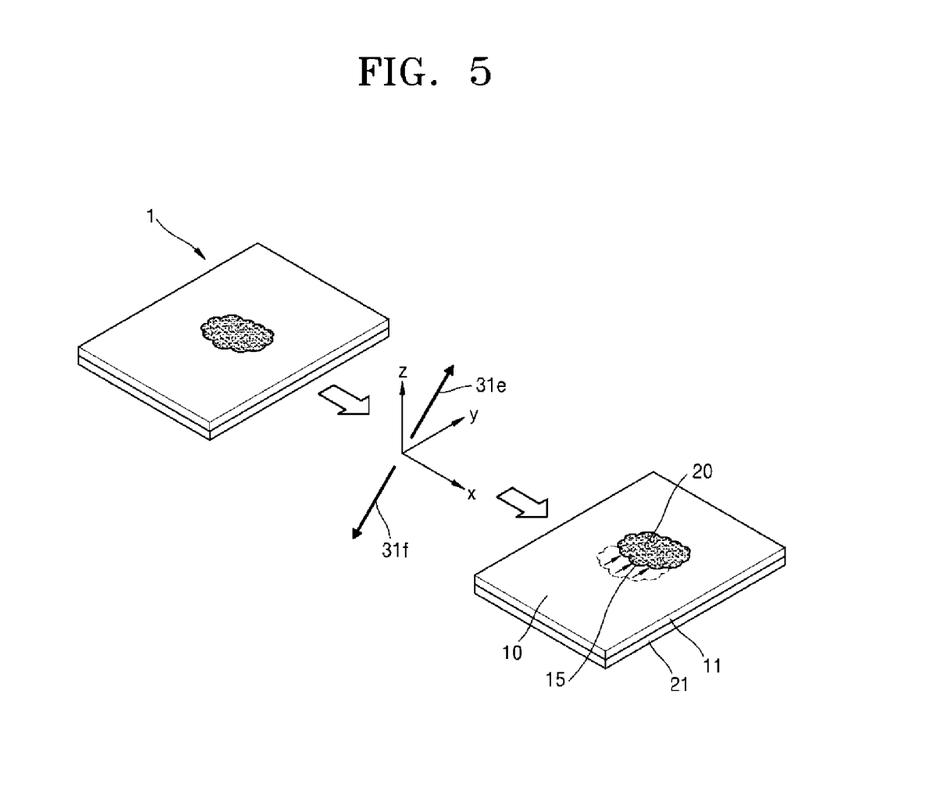
FIG. 5 is a view showing steps of a method of controlling a magnetic domain wall of a magnetic structure according to another embodiment of the present invention.

FIG. 5 is a view showing steps of a method of controlling a magnetic domain wall of a magnetic structure according to another embodiment of the present invention.

Referring to FIG. 5, when an external magnetic field 31 obliquely inclined at a predetermined angle with respect to a direction perpendicular to surface direction (x-axis and y-axis directions) of the magnetic structure 1 is applied to the magnetic domain wall 15, which has an arbitrary shape, of the magnetic structure 1 having perpendicular magnetic anisotropy, for example, when a fifth magnetic field 31$e$ is applied in a direction obliquely inclined within the range of the y-axis and the z-axis (in a direction not parallel with the magnetization directions of the magnetic domain wall and magnetic domains, respectively), the first magnetic domain 10 or the second magnetic domain 20 expands or contracts due to the energy difference between the magnetic domains formed in the magnetic structure 1. As a result, the magnetic domain wall 15 between the first magnetic domain 10 and the second magnetic domain 20 moves asymmetrically.

On the contrary, when a sixth magnetic field 31$f$ is applied in a direction opposite to the direction of the fifth magnetic field to the magnetic structure 1, in which the magnetic domain wall 15 has been moved, the magnetic domain wall 15 tends to move in a direction opposite to the moving direction. However, due to the initial horizontal component (y-axis direction) of the fifth magnetic field 31e, the magnetic domain wall 15 moves relatively shorter than the previously moved distance.

As a result, when a unit cycle in which the external magnetic field 31 is applied to the magnetic structure 1 repeatedly in the forward direction and the backward direction is carried out, the magnetization state can move with a constant spacing in a direction parallel to the magnetization direction of the magnetic domain wall or magnetic domains from the initial magnetization state of the magnetic structure 1 (here, in the y-axis direction, which is the magnetization direction of the magnetic domain wall since the magnetic structure has perpendicular magnetic anisotropy). Here, the externally-applied magnetic field 31 may have both components of a horizontal vector and a perpendicular vector.

That is, by applying to a magnetic structure having a plurality of magnetic domains and a magnetic domain wall between the magnetic domains a magnetic field that is not parallel with the magnetization direction of the magnetic domain wall and the magnetization direction of the magnetic domains, respectively; and by applying another magnetic field to the magnetic structure in a direction opposite to the direction of the magnetic field, the magnetization state can be moved uniformly in a direction parallel to the magnetization direction of the magnetic domain wall or the magnetization direction of the magnetic domains. Here, the magnetic field corresponds to the fifth magnetic field 31e, and another magnetic field corresponds to the sixth magnetic field 31f.

Figure 6:
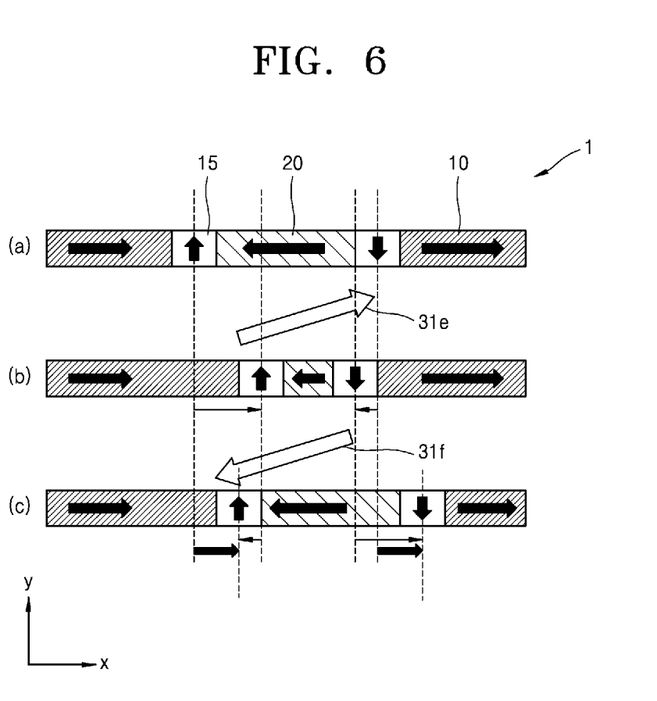
FIG. 6 is a view showing steps of a method of controlling a magnetic domain wall of a magnetic structure according to yet another embodiment of the present invention.

FIG. 6 is a view showing steps of a method of controlling a magnetic domain wall of a magnetic structure according to yet another embodiment of the present invention.

Referring to (a) and (b) of FIG. 6, in the magnetic structure 1 having horizontal magnetic anisotropy, the magnetization direction of the magnetic domains 10 and 20 and the magnetization direction of a magnetic domain wall 15 (a transverse domain wall in the case of a horizontal linear device) lie on the x-axis and the y-axis, respectively. First, a fifth magnetic field 31e may be applied to the magnetic structure 1. Each of the first magnetic domains 10 can expand and the second magnetic domain 20 can contract by the applied fifth magnetic field 31e. The fifth magnetic field 31e can have both a vector component in the magnetization direction of the magnetic domain wall 15 and a vector component in the magnetization direction of the magnetic domains 10 and 20. The direction of the fifth magnetic field 31e may be obliquely inclined at a predetermined angle between the magnetization direction of the magnetic domain wall 15 and the magnetization direction of the magnetic domains 10 and 20, or may not be parallel to the magnetization direction of the magnetic domain wall 15 and the magnetization directions of the magnetic domains 10 and 20, respectively.

Referring to (b) and (c) of FIG. 6, when a sixth magnetic field 31f is applied in a direction opposite to the fifth magnetic field 31e, the first magnetic domains 10, which have been expanded, and the second magnetic domain 20, which has been contracted, tend to return to their original states. However, the movement distance is different from that of the first movement due to the energy difference between the magnetic domain walls 15 and, in the case of the magnetic structure having horizontal magnetic anisotropy, the magnetic domain walls 15 move uniformly along the magnetization directions of the magnetic domains 10 and 20.

In other words, as described above with reference to the magnetic structure 1 having perpendicular magnetic anisotropy shown in FIGS. 4 and 5, when a magnetic field or another magnetic field is alternately applied, differences in size of the magnetic domains 10 and 20 and differences in energy between the magnetic domain walls 15 are generated and the domain walls 15 cannot be moved back to the initial position of magnetization state, and their positions are changed. Therefore, if the magnetic field or another magnetic field is alternately applied to the magnetic structure 1 continuously, the magnetic domain wall 15 can be uniformly moved in a certain direction. Here, the magnetic field corresponds to the fifth magnetic field 31e, and another magnetic field corresponds to the sixth magnetic field 31f.

Meanwhile, the magnetic field or another magnetic field is applied on the x-y plane, and the ultimate direction of the magnetic domain wall 15 may be one of the magnetization directions of the magnetic domains 10 and 20, that is, the positive x-axis or negative x-axis direction. If the applied magnetic field or another magnetic field exists on the x-z plane or the z-y plane, the magnetic domain wall 15 cannot be moved.

Based on the above description, a magnetic structure which can be easily controlled by an external magnetic field can avoid the destruction of a device due to the joule heat caused by electric current. Furthermore, in order to orient the magnetic structure in a certain direction of movement, it is not necessary to manufacture a complicated magnetic structure such as a serration shape, and the magnetization state of the magnetic structure can be controlled simply by an external magnetic field, thereby being easily applied in magnetic memory devices (not shown).

The magnetic structure may have any one of a ribbon shape, a line shape, and a thin film shape. A memory device can be implemented, which includes a data recording device and a read head connected to the magnetic structure, is capable of recording, reading and deleting data, and has a simple structure.

As described above, in the present invention, an external magnetic field slightly inclined at a predetermined angle with respect to the magnetization direction of a magnetic domain wall and magnetic domains that are present in a magnetic material having perpendicular magnetic anisotropy or horizontal magnetic anisotropy is applied and the direction of the external magnetic field is repeatedly changed and applied to the magnetic structure, thereby uniformly moving the magnetization state in a direction parallel to the magnetization direction of the magnetic domain wall or the magnetization direction of the magnetic domains depending on the type of each magnetic structure.

This phenomenon is not limited to the magnetic domain wall existing in the magnetic linear device but can also be applied to the magnetic domain wall having an arbitrary shape in a thin film. Furthermore, it can be applied to any magnetic devices including memory devices developed by applying such a technology.

Meanwhile, when the magnetic memory device is operated for a long time, the magnetic domain wall can be moved at a constant speed, so that it is very stable and a magnetic memory device that is required to process a large amount of information as the information industry develops can be realized.

While the present invention has been particularly shown and described with reference to embodiments shown in the drawings, it is only for illustrative purposes. It will be understood by those skilled in the art that many various modifications and other embodiments may be made. Therefore, the scope of the present invention is determined by the technical idea of the appended claims.

The invention claimed is:

1. A method for controlling a magnetic domain wall of a magnetic structure, the method comprising:
    a first step of applying a first magnetic field in a first direction to a magnetic structure having a plurality of magnetic domains and at least two magnetic domain walls among the plurality of magnetic domains, wherein each of the at least two magnetic domain walls is located at respective locations, and applying a second magnetic field in a second direction to the magnetic structure, the first direction being parallel to the magnetization direction of the at least two magnetic domain walls and the second direction being parallel to the magnetization direction of the magnetic domains; and
    a second step of applying a third magnetic field in a direction opposite to the first direction to the magnetic structure and applying a fourth magnetic field in a direction opposite to the second direction to the magnetic structure,
    wherein the at least two magnetic domain walls are moved equidistant from the respective locations in a direction parallel to the magnetization direction of the at least two magnetic domain walls or the magnetization direction of the magnetic domains.

2. The method of claim 1, wherein, when the magnetic structure has perpendicular magnetic anisotropy, the first and the second steps are carried out such that each of the at least two magnetic domain walls is moved equidistant from the respective locations in a direction parallel to the magnetization direction of the at least two magnetic domain walls.

3. The method of claim 1, wherein, when the magnetic structure has horizontal magnetic anisotropy, the first and the second steps are carried out such that the at least two magnetic domain walls are moved equidistant from the respective locations in a direction parallel to the magnetization direction of the magnetic domains.

4. The method of claim 1, wherein the at least two magnetic domain walls are moved equidistant from the respective locations in a direction parallel to the magnetization direction of the at least two magnetic domain walls or the magnetization direction of the magnetic domains, the magnetization direction of the at least two magnetic domain walls being determined according to the kind of the magnetic structure.

5. The method of claim 1, wherein the first and the second steps are carried out such that the at least two magnetic domain walls are moved equidistant from the respective locations in a direction parallel to the magnetization direction of the at least two magnetic domain walls or the magnetization direction of the magnetic domains while keeping a distance between the at least two magnetic domain walls constant.

6. The method of claim 1, wherein the first and the second steps are repeated alternately such that the magnetization state of the magnetic structure is moved uniformly by a predetermined distance in a direction parallel to the magnetization direction of the at least two magnetic domain walls or the magnetization direction of the magnetic domains.

7. The method of claim 1, wherein the second direction is perpendicular to the first direction.

8. The method of claim 1, wherein the first magnetic field or the third magnetic field includes a component parallel to the magnetization direction of the at least two magnetic domain walls, and there is an energy difference between the at least two magnetic domain walls, controlling the moving velocity of the at least two magnetic domain walls.

9. The method of claim 1, wherein the second magnetic field or the fourth magnetic field includes a component parallel to the magnetization direction of the plurality of magnetic domains, and there is a size difference between the magnetic domains, controlling the moving velocity of the at least two magnetic domain walls.

10. A magnetic memory device comprising the magnetic structure according to the method of claim 1.

11. The magnetic memory device of claim 10, wherein the magnetic structure has any one of a ribbon shape, a line shape, and a thin film shape.

12. The magnetic memory device of claim 10, further comprising:
    a data recording device and a read head connected to the magnetic structure, wherein the magnetic memory device is capable of recording or deleting data by the data recording device and the read head.

13. The method of claim 1, wherein, by the first step, each of the at least two magnetic domain walls is moved with different distance, and, by the second step, the at least two magnetic domain walls are moved equidistant from the respective locations.

14. A method for controlling a magnetic domain wall of a magnetic structure, the method comprising:
    a first step of applying a magnetic field to a magnetic structure having a plurality of magnetic domains and at least two magnetic domain walls among the plurality of magnetic domains, wherein each of the at least two magnetic domain walls is located at respective locations, the magnetic field being not parallel to the magnetization direction of the at least two magnetic domain walls and the magnetization direction of the magnetic domains, respectively; and
    a second step of applying another magnetic field in a direction opposite to the direction of the magnetic field to the magnetic structure,
    wherein the at least two magnetic domain walls are moved equidistant from the respective locations in a direction parallel to the magnetization direction of the at least two magnetic domain walls or the magnetization direction of the magnetic domains.

15. The method of claim 14, wherein, when the magnetic structure has perpendicular magnetic anisotropy, the first and the second steps are carried out such that the at least two magnetic domain walls are moved equidistant from the respective locations in a direction parallel to the magnetization direction of the magnetic domain wall.

16. The method of claim 14, wherein, when the magnetic structure has horizontal magnetic anisotropy, the first and the second steps are carried out such that the at least two magnetic domain walls are moved uniformly in a direction parallel to the magnetization direction of the magnetic domains.

17. The method of claim 14, wherein the at least two magnetic domain walls are moved uniformly in a direction parallel to the magnetization direction of the at least two magnetic domain walls or the magnetization direction of the magnetic domains, the magnetization direction of the at least two magnetic domain walls being determined according to the kind of the magnetic structure.

18. The method of claim 14, wherein the first and the second steps are carried out such that the at least two magnetic domain are moved uniformly in a direction parallel to the magnetization direction of the magnetic domain wall or the magnetization direction of the magnetic domains while keeping the distance between the at least two magnetic domain walls constant.

19. The method of claim 14, wherein the first and the second steps are repeated alternately such that the magnetization state of the magnetic structure is moved uniformly by a predetermined distance in a direction parallel to the magnetization direction of the at least two magnetic domain walls or the magnetization direction of the magnetic domains.

20. A magnetic memory device comprising the magnetic structure according to the method of claim 14.

21. The magnetic memory device of claim 20, wherein the magnetic structure has any one of a ribbon shape, a line shape, and a thin film shape.

22. The method of claim 14, wherein, by the first step, each of the at least two magnetic domain walls is moved with different distance, and, by the second step, the at least two magnetic domain walls are moved equidistant from the respective locations.

* * * * *